United States Patent [19]
Bowers et al.

[11] Patent Number: 5,146,181
[45] Date of Patent: Sep. 8, 1992

[54] BICMOS OUTPUT STAGE WITH IMPROVED OUTPUT VOLTAGE SIGNAL

[75] Inventors: Derek F. Bowers, Sunnyvale; Peter S. Henry, Fremont, both of Calif.

[73] Assignee: Analog Devices, Inc., Norwood, Mass.

[21] Appl. No.: 764,537

[22] Filed: Sep. 24, 1991

[51] Int. Cl.⁵ .............................................. H03F 3/30
[52] U.S. Cl. ...................................... 330/268; 330/51; 330/300
[58] Field of Search ................. 330/51, 267, 268, 273, 330/274, 300

[56] References Cited

U.S. PATENT DOCUMENTS 4,482,868 11/1984 Whatley ........................... 330/268 X

FOREIGN PATENT DOCUMENTS 114013 9/1980 Japan ..................................... 330/268

Primary Examiner—James B. Mullins
Attorney, Agent, or Firm—Koppel & Jacobs

[57] ABSTRACT

The output stage for a feedback amplifier has a diode circuit to provide quiescent current to the output transistors, and a diode turnoff circuit that renders the diodes non-conductive for an input signal that sends the stage output voltage low. A swing transistor between the stage's output terminal and a low voltage bus is actuated by the same input signal to drive the output voltage to the level of the low voltage bus. Both the diode turnoff circuit and the swing transistor are preferably MOSFETs.

14 Claims, 1 Drawing Sheet

BICMOS OUTPUT STAGE WITH IMPROVED OUTPUT VOLTAGE SIGNAL

BACKGROUND OF THE INVENTION

1. Field of the Invention

This invention relates to electronic circuitry, and more particularly to feedback amplifier output stages with an output voltage that swings between high and low levels as determined by a variable input signal.

2. Description of the Prior Art

It is desirable that output stages for feedback amplifiers, such as operational amplifiers (op amps), have a wide output voltage swing over the range of input signals. A conventional output stage is shown in FIG. 1. As described below, it is characterized by a somewhat limited output voltage swing; the present invention seeks to improve upon this characteristic.

The output stage has a pair of bipolar transistors Q1 and Q2 that are connected in series between high and low voltage buses V+ and V−. By "high" and "low" it is meant that V+ is at a higher relative potential than V−, not necessarily that the absolute value of V+ is greater than that of V− (although V− may typically be at ground potential). Q1 is an npn device while Q2 is pnp so that while one transistor is ON the other is OFF, as explained in detail below.

A current source I1 is connected on one side to V+ and on the other side to drive current into the base of Q1 and to a series-connected diode circuit consisting of diodes D1 and D2. The diodes are oriented to conduct current from I1 to the base of Q2.

An input bipolar transistor Q3 has its base connected to the output of the feedback amplifier, such as op amp 2, for which the circuit serves as an output stage. The collector-emitter circuit of Q3 is connected between the diode circuit and V−, with the collector of Q3 connected in common with the base of output transistor Q2. An output terminal T1 from the circuit is taken between the emitters of Q1 and Q2.

Ideally, the voltage at T1 should equal V+ when the input signal to Q3 from op amp 2 is in one state, and should equal V− when the input signal is in its opposite state. Another requirement of the circuit is for rapid switching; D1 and D2 supply quiescent current to the output transistors for this purpose. Without the quiescent transistor current, a time delay would have to be incurred each time a transistor was turned on to allow enough time for charging the transistor. Also, the provision of quiescent transistor current inhibits high crossover distortion. Two diodes are required because there are two base-emitter circuits between the bases of Q1 and Q2.

To explain the operation of the output stage, assume that the input signal from op amp 2 is initially low, turning Q3 OFF. This causes the current from I1 to flow into the bases of both Q1 and Q2, turning npn device Q1 ON and pnp device Q2 OFF. The output voltage at T1 thus goes to V+.

Assume now that the input signal from op amp 2 switches to high. This causes Q3 to switch to a conductive state, shorting the base of Q2 to V− to turn Q2 ON. The current from I1 is diverted away from the base of Q1 and instead flows to V− through Q3, causing Q1 to turn OFF. The desired result is to set the output voltage at T1 to V−. However, the presence of diodes D1 and D2 prevents the output voltage from swinging all the way to V−. This is because diodes D1 and D2 are implemented in a conventional manner as npn transistors with their bases and collectors connected together as the diode anode, and their emitters functioning as the diode cathodes. Thus, there is a base-emitter voltage drop (approximately 0.7 volts) across each diode. The voltage at the base of Q1 is therefore two base-emitter drops above V−. This voltage drops by one base-emitter increment from the base of Q1 to T1, leaving the voltage at T1 still one base-emitter drop above V−.

SUMMARY OF THE INVENTION

In view of the above problems, the present invention seeks to provide a feedback amplifier output stage that achieves an improved voltage swing with only one voltage supply other than the voltage reference, and without degrading either crossover distortion or operating speed.

This goal is achieved by adding a diode turnoff circuit that renders the diode circuit non-conductive when the output terminal swings to V−, but leaves it conductive when the output is at V+. The diode turnoff circuit preferably consists of a bypass transistor that connects V− to the opposite side of the diode circuit. The bypass transistor is preferably a metal oxide semiconductor field effect transistor (MOSFET) whose gate is connected in common with the gate of a second MOSFET used as the input transistor for the stage.

In addition to the bypass transistor, a swing transistor is added that is connected between the output terminal and V−. The swing transistor, also preferably a MOSFET, pulls the output voltage to V− when the input voltage is high. Bypassing the diodes to turn them off at the same time the swing transistor is actuated allows Q1 to turn fully off, so that the swing transistor can pull the output voltage substantially all the way to V−.

These and other features and advantages of the invention will be apparent to those skilled in the art from the following detailed description, taken together with the accompanying drawings, in which:

DETAILED DESCRIPTION OF PREFERRED EMBODIMENTS

Figure 1:
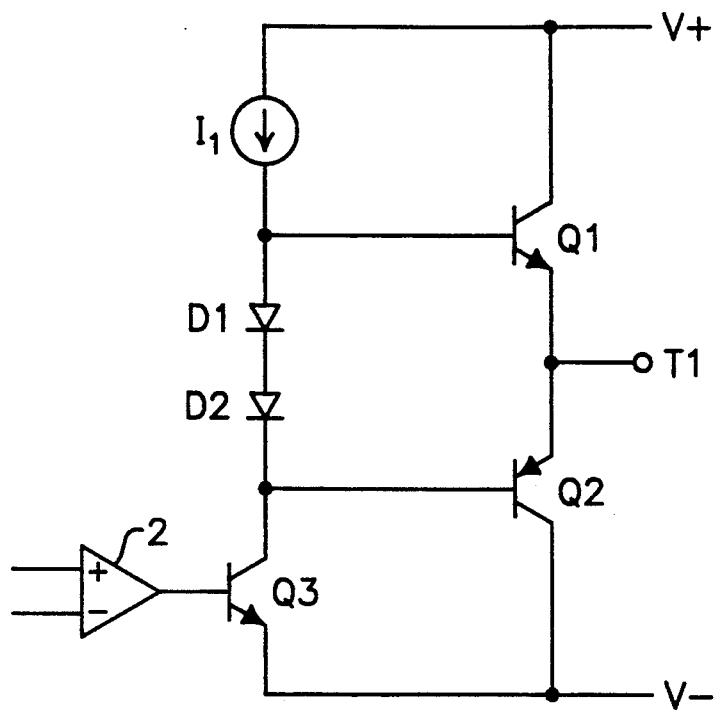
FIG. 1 is a schematic diagram of a prior feedback amplifier output stage, described above.
Figure 2:
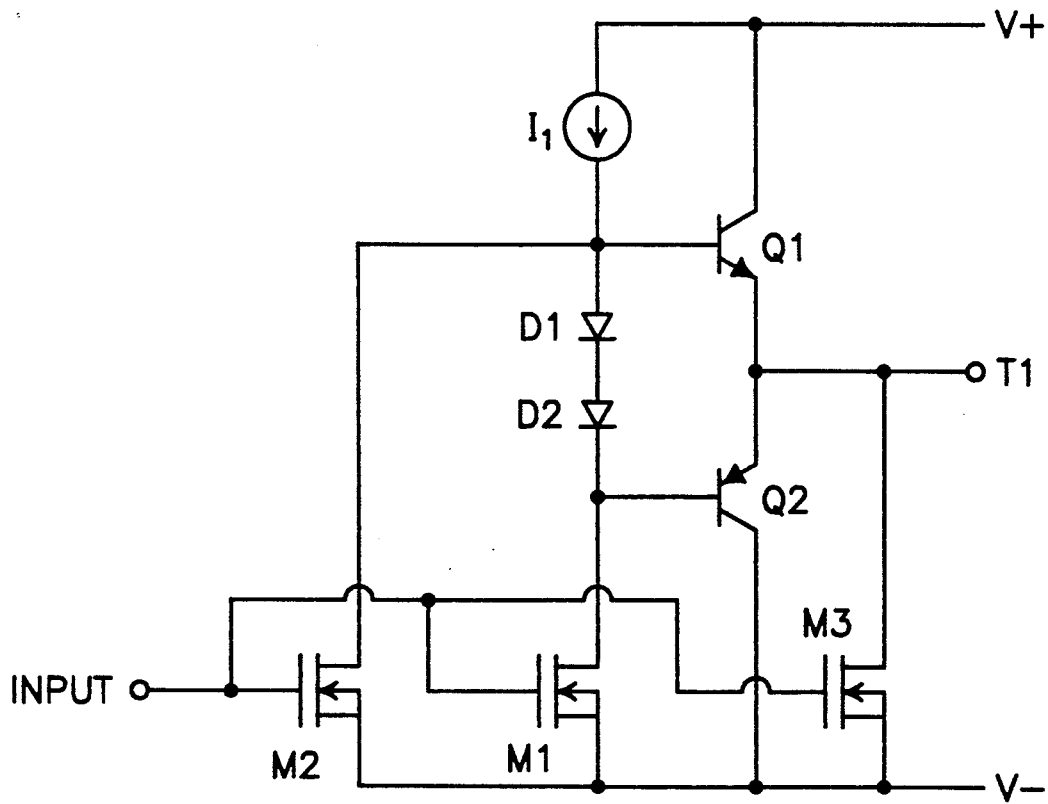
FIG. 2 is a schematic diagram of an improved feedback amplifier output stage in accordance with the invention.

A feedback amplifier output stage that increases the output voltage swing essentially all the way to V+ and V−, without degrading either crossover distortion or operating speed, is shown in FIG. 2. The same reference numerals are used for elements that are common to FIG. 1. In the FIG. 2 circuit the input transistor is replaced with a MOSFET M1. An additional MOSFET M2 has its source-drain circuit connected between the base of Q1 and V−, short-circuiting the diodes D1 and D2 when M2 is conductive. The gate of M2 is connected in common with the gate of M1.

A third MOSFET M3 has its source-drain circuit connected between T1 and V−, with its gate connected in common with the gates of M1 and M2. M3 serves to drive the voltage at T1 down virtually to V− when the input voltage is high.

When the input voltage is low, M1, M2 and M3 are OFF, Q1 is ON and Q2 is OFF, setting the T1 voltage at V+. When the input voltage swings high, M1, M2 and M3 all switch ON, while Q1 turns OFF and Q2 turns ON. M2 shunts the I1 current away from D1 and D2, short-circuiting the diodes and preventing them from conducting. In the absence of M2, D1 and D2 will always be conductive and will thus prevent Q1 from turning fully off. With D1 and D2 shunted, M3 in the ON state pulls the voltage at T1 down virtually all the way to V−. The result is an improved output voltage swing that ranges between V+ and V−, with a low cross-over distortion and no loss of operating speed.

All of the MOSFETs are preferably roughly equal in size, producing balanced current flows. Matching M3 with M1 controls the M3 quiescent current. The MOSFETs could be replaced by bipolar transistors, but bipolar devices saturate at the operating voltage levels and require relatively complex circuitry to successfully implement. The circuit might also be implemented with p-channel junction FETs in place of the MOSFETs.

While particular embodiments of the invention have been shown and described, numerous variations and alternate embodiments will occur to those skilled in the art. Accordingly, it is intended that the invention be limited only in terms of the appended claims.

We claim:

1. In a feedback amplifier output stage having high and low voltage buses, first and second output transistors connected between said voltage buses, an output terminal connected between said output transistors, a current source connected to supply quiescent current to said first transistor, a diode circuit connected to supply quiescent current from said current source to said second transistor, and an input transistor connected to said first transistor through said diode circuit and to said second transistor to set said transistors in opposite conductive states in response to an input signal applied to said input transistor, the improvement comprising:

a diode turnoff circuit means connected to render said diode circuit non-conductive in response to a first input signal that turns said first transistor OFF and said second transistor ON, and conductive in response to a second input signal that turns said first transistor ON and said second transistor OFF, thereby preventing said diode circuit from limiting the voltage swing at said output terminal when said first input signal is applied, a swing transistor connected between said output terminal and said low voltage bus, and a control circuit for said swing transistor connected to render said swing transistor conductive in response to said first input signal and non-conductive in response to said second input signal, thereby driving said output terminal substantially to the voltage level of said low voltage bus in response to said first input signal.

2. A feedback amplifier output stage of claim 1, said diode turnoff circuit comprising a bypass transistor having a conductive circuit connected between said low voltage bus and the opposite side of said diode circuit from said low voltage bus.

3. The feedback amplifier output stage of claim 2, wherein said bypass transistor has a control terminal connected in common with said input transistor to receive an input signal.

4. The feedback amplifier output stage of claim 2, wherein said swing transistor has a control terminal connected in common with said input and bypass transistors to receive an input signal.

5. The feedback amplifier output stage of claim 2, said first and second output transistors comprising bipolar transistors, and said input, bypass and swing transistors comprising respective field effect transistors (FETs).

6. The feedback amplifier output stage of claim 5, said input, bypass and swing transistors comprising respective metal oxide semiconductor (MOS) FETs.

7. In a feedback amplifier output state having high and low voltage buses, first and second bipolar output transistors with respective bases, collectors and emitters and their collector-emitter circuits connected in series between said high and low voltage buses, an output terminal connected between said output transistors, a plurality of series-connected diodes connecting the bases of said first and second bipolar transistors, and an input transistor having a control terminal connected to receive an input signal, said input transistor including a switch circuit that is controlled by the signal applied to said control terminal and is connected between said low voltage bus on one side and said series-connected diodes and the base of said second bipolar transistor on the other side, one of said bipolar transistors being npn and the other pnp so that they assume opposite conductive states, the improvement comprising:

bypass circuit means for short-circuiting said diodes to said low voltage bus to render them non-conductive in response to an input signal that turns said first and second bipolar transistors respectively OFF and ON, thereby preventing said diodes from limiting the voltage swing at said output terminal when said input signal is applied, and a swing transistor connected between said output transistors and said low voltage bus, and a control circuit for said swing transistor connected to render said swing transistor conductive in response to said input signal, thereby driving said output terminal substantially to the voltage level of said low voltage bus in response to said input signal.

8. The feedback amplifier output stage of claim 7, said bypass circuit means comprising a bypass transistor having a conductive circuit connected between said low voltage bus and the opposite side of said series-connected diodes from said low voltage bus.

9. The feedback amplifier output stage of claim 8, wherein said bypass transistor has a control terminal connected in common with said input transistor to receive an input signal.

10. The feedback amplifier output stage of claim 9, said input and bypass transistor comprising field effect transistor (FETs).

11. The feedback amplifier output stage of claim 10, said input and bypass transistors comprising metal oxide semiconductor (MOS) FETs.

12. The feedback amplifier output stage of claim 8, wherein said swing transistor has a control terminal connected in common with said input and bypass transistors to receive an input signal.

13. The feedback amplifier output stage of claim 8, said input, bypass and swing transistors comprising respective field effect transistors (FETs).

14. The feedback amplifier output stage of claim 13, said input, bypass and swing transistors comprising respective metal oxide semiconductor (MOS) FETs.

* * * * *